United States Patent [19]

Kambara et al.

[11] 4,102,715
[45] Jul. 25, 1978

[54] METHOD FOR DIFFUSING AN IMPURITY INTO A SEMICONDUCTOR BODY

[75] Inventors: Ginjiro Kambara, Ashiya; Susumu Koike, Ibaraki; Toshio Matsuda, Ohtsu, all of Japan

[73] Assignee: Matsushita Electric Industrial Co., Ltd., Osaka, Japan

[21] Appl. No.: 751,124

[22] Filed: Dec. 16, 1976

[30] Foreign Application Priority Data

| Dec. 19, 1975 [JP] | Japan | 50/152659 |
| Dec. 19, 1975 [JP] | Japan | 50/152660 |
| Dec. 19, 1975 [JP] | Japan | 50/152661 |
| Dec. 19, 1975 [JP] | Japan | 50/152662 |
| Dec. 19, 1975 [JP] | Japan | 50/152664 |
| Dec. 19, 1975 [JP] | Japan | 50/152668 |

[51] Int. Cl.$^2$ ............................ H01L 21/225
[52] U.S. Cl. ..................... 148/188; 148/1.5; 148/187; 148/191
[58] Field of Search ............ 148/188, 187, 1.5, 191

[56] References Cited

U.S. PATENT DOCUMENTS

| 3,437,533 | 4/1969 | Dingwall | 148/189 X |
| 3,869,322 | 3/1975 | Cuomo et al. | 148/188 |
| 4,006,046 | 2/1977 | Pravin | 148/188 X |

*Primary Examiner*—G. Ozaki
*Attorney, Agent, or Firm*—Stevens, Davis, Miller & Mosher

[57] ABSTRACT

A silicon oxide layer containing a group III element such as boron, aluminum or gallium is formed on a semiconductor substrate. The substrate is then heat treated at 600° C – 1200° C in a nitrogen atmosphere and a diffusion process carried out thereafter. In this manner, the impurity diffused surface of the semiconductor body is controlled to a low concentration not higher than $10^{18}/cm^3$ of the group III element. This is due to the fact that the silicon oxide layer containing the group III element (that is, the so-called doped oxide) is partly converted to a nitride in the course of an ammonia treatment resulting in an impurity source for the low concentration diffusion. The present method is useful in forming the base region of an NPN transistor, for example.

10 Claims, 17 Drawing Figures

METHOD FOR DIFFUSING AN IMPURITY INTO A SEMICONDUCTOR BODY

The present invention relates to a method for diffusing an impurity into a semiconductor body, and more particularly to an improvement in a diffusion process using a silicon oxide layer containing a group III element (that is, a so-called doped oxide) as an impurity source.

A diffusion method in which a silicon dioxide ($SiO_2$) layer containing a group III element such as boron (B), aluminum (Al) or gallium (Ga) is formed; that is, a layer of $B_2O_3$—$SiO_2$, $Al_2O_3$—$SiO_2$ or $Ga_2O_3$—$SiO_2$, and the group III element is diffused into the semiconductor body using the layer as an impurity source is usually referred to as a doped oxide process and has been widely known as a method for diffusing a P-type impurity into the semiconductor body. Taking a method which uses Ga as the impurity as an example, a Ga-doped oxide layer is formed on a silicon substrate by one of several film forming processes. These processes include an oxidation reaction in which a gas mixture of silane ($SiH_4$) and gallium chloride ($GaCl_3$) is reacted in an oxygen atmosphere at 500° C – 1000° C, an oxidation reaction or a thermal decomposition reaction in which organic compounds of silicon and gallium are reacted in an inert gas atmosphere or an oxidizing atmosphere at 300° C – 700° C, or a complex reaction in which an oxidation reaction of gallium chloride and a thermal oxidation reaction of the silicon substrate are simultaneously carried out. The diffusion into the silicon substrate is carried out in an inert gas atmosphere or a weak oxidizing atmosphere.

However, according to the conventional doped oxide diffusion process described above, a surface concentration of Ga diffused into the silicon body tends to saturate to $10^{19} - 10^{20}$ atoms/cm$^3$, as shown in FIG. 1, when the percent content of $Ga_2O_3$ in the $Ga_2O_3$—$SiO_2$ layer exceeds several %, and it is difficult to control the surface concentration to a value not higher than $10^{18}$ atoms/cm$^3$. Accordingly, the above doped oxide process has been exclusively used to form a high concentration diffused region such as an emitter region of a PNP transistor or a P$^+$-type isolation region. A similar trend is also observed in the doped oxide process using a group III element other than Ga, that is, the doped oxide process using $Al_2O_3$—$SiO_2$ or $B_2O_3$—$SiO_2$.

In the manufacture of a semiconductor device, a diffusion process which assumes a surface concentration in the order of $10^{16} - 10^{17}$ atoms/cm$^3$ is sometimes required. In such a case, it is very difficult to control the diffusion source in the conventional process because the concentration of gallium oxide in the composite layer must be very low such as in the order of $10^{-3} - 10^{-5}$% as seen from FIG. 1. For the element other than gallium, that is, for boron or aluminum, the low concentration diffusion is very difficult to attain by the conventional doped oxide process.

It is an object of the present invention to improve the prior art doped oxide process and to provide a method which enables control of the impurity concentration to a desired value equal to or below $10^{18}$ atoms/cm$^3$.

It is another object of the present invention to provide a diffusion method which improves the prior art doped oxide process by selectively changing the impurity concentration on the surface of the semiconductor body and the diffusion depth.

In order to attain the above objects, a silicon oxide layer containing an impurity is formed on a given semiconductor substrate, which is then heat treated in an ammonia containing atmosphere. The silicon oxide (doped silicon) formed on the semiconductor substrate has at least a portion of the impurity element, e.g. gallium (Ga) contained therein converted to a nitride (GaN) through the heat treatment in the ammonia atmosphere at 600° C – 1200° C. According to the present method, therefore, a low concentration diffusion in the order of less than $10^{18}$ atoms/cm$^3$ can be realized with the doped oxide containing the gallium in the order of several %.

In addition, when a mask of ammonia impermeable material is formed on the silicon oxide layer containing the impurity formed on the semiconductor substrate during the heat treatment in the ammonia containing atmosphere, it is possible to selectively control the impurity concentration on the surface of the semiconductor body and the diffusion depth.

The invention will now be further described by way of example with reference to the accompanying drawings.

In a first embodiment of the present invention, silane ($SiH_4$) including gallium chloride ($GaCl_3$) in the amount of 20 mole % or less is used as a diffusion source for the doped oxide. Carbon dioxide gas and hydrogen gas are added thereto to form a reaction gas, which is heated to 700° C to form a composite layer of gallium oxide ($Ga_2O_3$) — silicon dioxide ($SiO_2$) of the thickness of 1000 Å on an N-type silicon wafer having a resistivity of 8 – 12 Ω.cm. Then, the wafer is heat treated in an ammonia gas flow (flow rate 2 l/min.) at 700° C for 30 minutes. Thereafter, a diffusion process is carried out in a nitrogen atmosphere at 1150° C for 30 minutes. As a result, a surface concentration not higher than $10^{18}$ atoms/cm$^3$ was obtained when the concentration of $Ga_2O_3$ was not higher than about 6 mole %, as seen from a curve A in FIG. 2 and the control of the impurity concentration by the diffusion was facilitated because the dependency of the surface impurity concentration after the diffusion on the concentration of $Ga_2O_3$ in the doped oxide was relieved.

Figure 1:
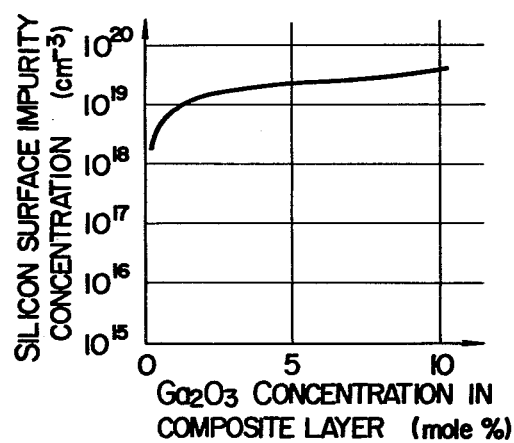
FIG. 1 is a chart illustrating the relation between the concentration of an impurity source and the impurity concentration on the surface of a semiconductor body after diffusion when a prior art doped oxide process is used with a composite layer of $Ga_2O_3$—$SiO_2$.
Figure 2:
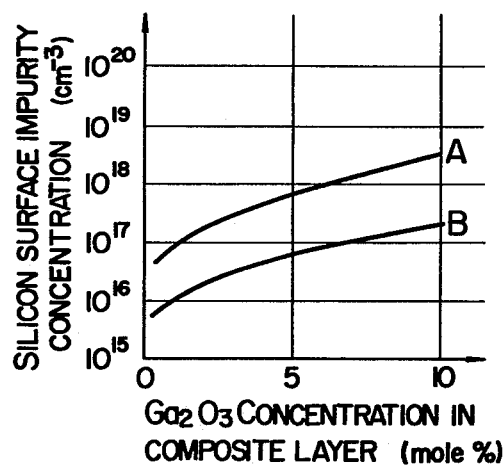
FIGS. 2, 3 and 4 are charts illustrating the relationships between concentrations of impurity sources and impurity concentrations on surfaces of semiconductor bodies after diffusion when a method in accordance with the present invention is carried out with composite layers of $Ga_2O_3$—$SiO_2$, $Al_2O_3$—$SiO_2$ and $B_2O_3$—$SiO_2$, respectively.

When the doped oxide of the same composition as that of the first embodiment was used under the treatment condition of ammonia gas flow (flow rate 2 l/minute) at 1000° C for 30 minutes followed by the same diffusion process, the dependency of the surface impurity concentration after the diffusion on the concentration of $Ga_2O_3$ in $Ga_2O_3 - SiO_2$ was further relieved, as shown by curve B in FIG. 2.

The doped oxide may be formed by a process other than the reaction of $GaCl_3$ and $SiH_4$ used in the above embodiment. The diffusion process after the heat treatment in the ammonia atmosphere need not be carried out in the nitrogen atmosphere but it may be carried out in any of argon, ammonia, oxygen or hydrogen gas flow. When it is carried out in the ammonia gas flow, the ammonia heat treatment and the ammonia diffusion process need not be separately carried out but may be carried out simultaneously.

In accordance with the method of the present invention, at least a portion of $Ga_2O_3$ in $Ga_2O_3 - SiO_2$ reacts with ammonia in the following manner to produce gallium nitride (GaN).

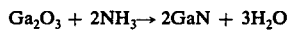

Because GaN is much more stable than $Ga_2O_3$, reacts more slowly with the silicon substrate and has a higher melting point, it is considered that the rate of introduction of Ga into the silicon substrate is lowered. Accordingly, by changing the treatment condition in the ammonia atmosphere so that the rate of conversion of $Ga_2O_3$ to GaN is controlled, the amount of introduction of Ga into the silicon substrate, that is, a low concentration of the diffusion concentration can be controlled with a high reproducibility.

A second embodiment which uses $Al_2O_3 - SiO_2$ as the diffusion source for the doped oxide is now explained. A reaction gas mixture comprising silane ($SiH_4$) and aluminum chloride ($AlCl_3$) added thereto in the amount of 20 mole % or less, together with carbon dioxide gas and hydrogen gas, are used at 700° C to form a composite layer of $Al_2O_3 - SiO_2$ of the thickness of 1000 Å on an N-type silicon wafer having a resistivity of 8 - 12 Ω.cm. It is then heat treated in an ammonia gas flow (flow rate of 2 l/minute) at 700° C for 30 minutes. Thereafter the diffusion process is carried out in the nitrogen atmosphere at 1150° C for 30 minutes. As a result, the surface impurity concentration of Al in the silicon wafer is controlled to a low concentration not higher than $10^{18}$ atoms/cm$^3$ when the content of $Al_2O_3$ is not higher than about 7.5 mole %, as shown by curve A in FIG. 3.

Figure 3:
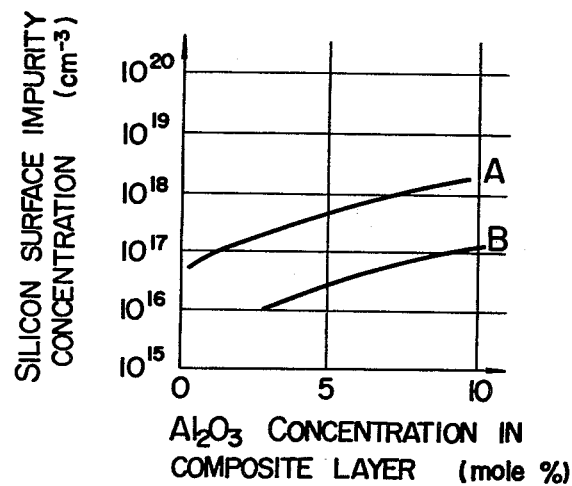

When the heat treatment condition in the ammonia gas flow (flow rate of 2 l/minute) was changed to a condition of 1000° C and 30 minutes, a diffused layer of lower concentration, i.e. $10^{17}$ atoms/cm$^3$ or less, was obtained as shown by curve B in FIG. 3.

$Al_2O_3$ in the composite layer reacts in the following manner in the ammonia atmosphere;

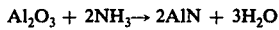

It is considered that the aluminum nitride (AlN) produced by the above reaction restricts the amount of introduction of Al during the diffusion process resulting in a low concentration diffusion layer.

Figure 4:
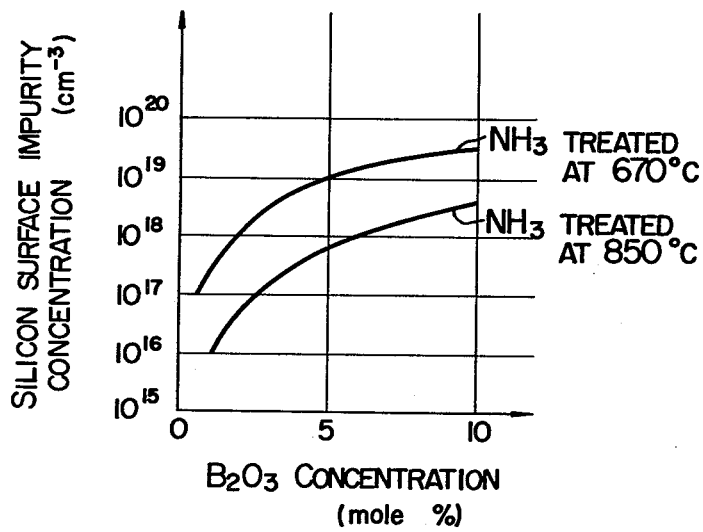

Similarly to the doped oxides containing Ga and Al, a doped oxide containing boron may also be used. In this case, the doped oxide as the impurity source is reacted with a gas mixture of silane ($SiH_4$) and boron halide such as $BCl_3$ in an oxygen atmosphere at about 700° C to decompose it or a gas mixture of silane ($SiH_4$) and diborane ($B_2H_6$) in an oxygen atmosphere at 300° C - 500° C to decompose it to form a composite layer of $B_2O_3 - SiO_2$ on a given semiconductor substrate. The conditions of the ammonia treatment for the diffusion source of the boron doped oxide and the diffusion process may be identical to those for the Ga-doped oxide or the Al-doped oxide. The diffusion characteristics thereof are shown in FIG. 4. More specifically, the two curves of FIG. 4 show the surface concentrations of the boron impurity which were obtained by the Al diffusing treatment at the same diffusing conditions mentioned above after the ammonia treatment had been effected for 30 minutes at 670° C and 850° C respectively.

A third embodiment of the present invention, that is, selective diffusion process by the doped oxide is now explained. In the present embodiment, in addition to the steps of the previous embodiments, an ammonia impermeable film is formed over the doped oxide composite layer as the impurity source except an area into which the impurity is to be selectively diffused during the ammonia treatment of the composite layer, or an impurity impermeable film which prevents the supply of the impurity from the doped oxide composite layer is formed during the diffusion process.

Figure 5:
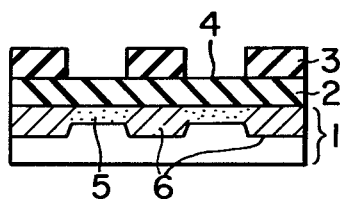
FIGS. 5 to 7 show diffusion profiles in sections of semiconductor bodies after diffusion when selective diffusion in accordance with the present invention is carried out.

FIG. 5 illustrates one example of the present embodiment, in which $SiO_2 - B_2O_3$ composite layer 2 is formed on an N-type silicon substrate 1, and an $SiO_2$ film 3 free of impurity is selectively formed on the composite layer 2. Thereafter, the assembly was subjected to the ammonia treatment and the diffusion process to produce a diffusion profile in a section of the semiconductor body as shown in FIG. 5. In this example, the $SiO_2 - B_2O_3$ composite layer 2 as the impurity source is effected by the ammonia treatment only at those area under openings (windows) 4 in the $SiO_2$ film 3. As a result, the diffusion profile in the semiconductor body after the diffusion process has shallow diffusion regions 5 of low concentration immediately under the openings 4 and deep diffusion regions 6 of high concentration immediately under the $SiO_2$ film.

Figure 6:
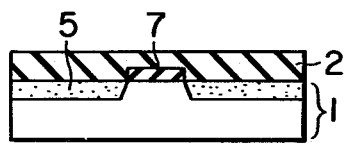

FIG. 6 shows a diffusion profile in a section of a semiconductor body manufactured by selectively forming $SiO_2$ films 7 at given areas on the N-type silicon substrate 1, applying the $SiO_2 - B_2O_3$ composite layer 2 on the entire surface of the $SiO_2$ films 7 and the substrate 1 and then subjecting the assembly to the ammonia treatment and the diffusion process. In the present example, since the $SiO_2$ films 7 serve as the resists to the impurity diffusion, the diffusion layer is not formed immediately under the $SiO_2$ films 7 and shallow diffusion regions 5 of low concentration are formed at other areas.

Figure 7:
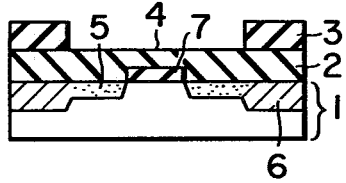

FIG. 7 shows a combination of the two previous processes, in which the $SiO_2$ films 7 are selectively formed at given areas on the N-type silicon substrate 1. Then, the entire surface is covered by the $SiO_2 - B_2O_3$ composite layer 2. Thereafter, the $SiO_2$ film 3 is selectively formed thereon through a mask pattern different than that for the $SiO_2$ film 7. The assembly is then subjected to the ammonia treatment and the diffusion process to produce a diffusion process in a section of the semiconductor body as shown in FIG. 7. In the present example, since those areas of the $SiO_2 - B_2O_3$ composite layer 2 as the impurity source which lie immediately under the outermost $SiO_2$ film 3 are not ammonia treated, deep diffusion regions 6 of high concentration are formed under those areas. Under the opening 4, shallow diffusion regions 5 of low concentration and non-diffusion region immediately under the $SiO_2$ film 7 are formed.

Figure 8:
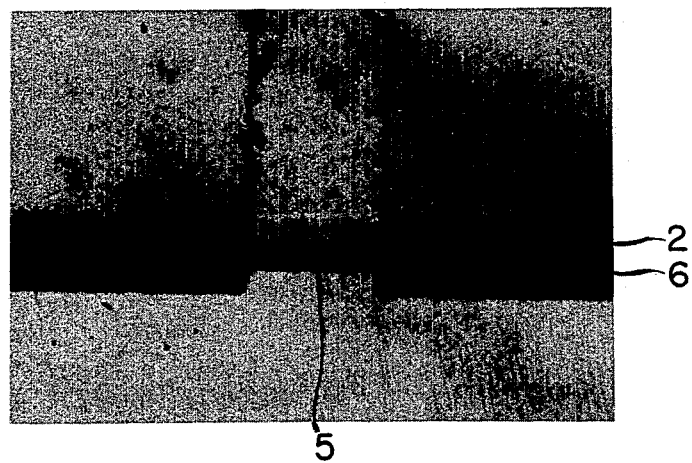
FIG. 8 is a photograph showing a diffusion profile in a section of a semiconductor body produced in accordance with the present method.

FIG. 8 shows a photograph of a magnified sectional view for illustrating the diffusion profile observed by an angled polishing method for a semiconductor body manufactured by the steps of the above embodiment. In this example, the $SiO_2 - B_2O_3$ composite layer 2 (containing about 5 mole % of $B_2O_3$) having a thickness of 1000 Å was treated in the ammonia gas flow (flow rate of 2 l/minute) at 1000° C for 30 minutes and the diffusion process was then carried out at 1150° C for 30 minutes. The diffusion region 5 showed a surface impurity concentration of $3 \times 10^{17}$ atoms/cm$^3$, diffusion depth of 0.8 μm, and the diffusion region 6 showed a surface impurity concentration of $2 \times 10^{20}$ atoms/cm$^3$ and a diffusion depth of 2.3 μm. The surface impurity concentration of $2 \times 10^{20}$ atoms/cm$^3$ was obtained without an ammonia treatment and was provided for comparison with the $3 \times 10^{17}$ atoms/cm$^3$ surface impurity concentration of region 5.

Figure 9:
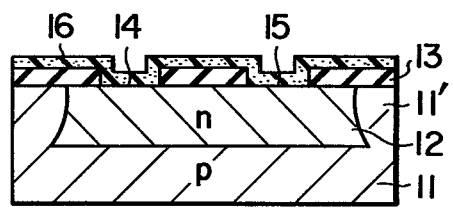
FIGS. 9 to 11 show steps of one embodiment of the present method.
Figure 10:
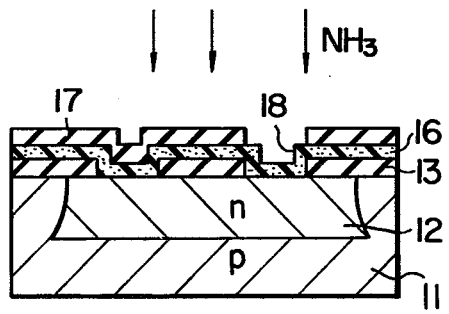
Figure 11:
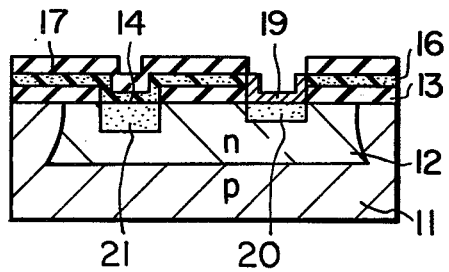

FIGS. 9 to 11 show flow charts for a fourth embodiment in which a semiconductor device having two independent regions of the same area and shape and of different resistivity is manufactured.

Referring to FIG. 9, a semiconductor body having an N-type isolated island 12 in a P-type silicon substrate 11 is prepared. The semiconductor substrate is covered with an $SiO_2$ film 13 and windows 14 and 15 are formed at selected areas in the $SiO_2$ film 13. Then, an $SiO_2 - B_2O_3$ composite film 16 is formed to cover the entire surface.

Then, as shown in FIG. 10, an $SiO_2$ film 17 is formed on the $SiO_2 - B_2O_3$ composite film 16 and a window having the same shape and size as the window 15 in the $SiO_2$ film 13 is formed in the $SiO_2$ film 17 to form an exposed area 18 of the $SiO_2 - B_2O_3$ composite film 16.

Thereafter, the assembly is heat treated in the ammonia gas flow to convert a portion of the $SiO_2 - B_2O_3$ composite layer to a nitride containing material 19 and then the diffusion process is carried out to form two boron-doped diffusion regions 20 and 21 in the N-type silicon island 12. Now considering the two diffusion regions thus formed, the diffusion region 20 has a low surface concentration of the impurity (boron) and a shallow diffusion depth because the nitrogen containing material 19 is used as the impurity source. On the other hand, the diffusion region 21 has a high impurity concentration and a deep diffusion depth because the impurity source within the window 14 is covered by the $SiO_2$ film 17 and hence it is not subjected to the ammonia treatment. Specifically, when the boron content of the doped oxide as the impurity source is $10^{20}$ atoms/cm$^3$, the ammonia treatment is effected in the ammonia gas flow of 2 l/minute at 600° – 1200° C for 30 – 60 minutes and the diffusion process is carried out at 1150° C for 30 – 60 minutes, the diffusion region 20 has the surface boron concentration of $10^{16} - 10^{18}$ atoms/cm$^3$ and the diffusion depth of 1 – 1.5 μm while the diffusion region 21 has the surface boron concentration of $10^{18} - 10^{19}$ atoms/cm$^3$ and the diffusion depth of 2.0 – 3 μm. When these diffusion regions are used as resistors in the semiconductor body, the diffusion region 21 can provide a sheet resistance of 200 Ω/cm$^2$ and the diffusion region 20 can provide a sheet resistance of 20 kΩ/cm$^2$ at maximum.

Referring to FIGS. 12 to 17, a fifth embodiment is explained wherein the teaching of the present invention is applied to a transistor having base junctions of different depths; that is, a so-called graft base structure transistor.

Figure 12:
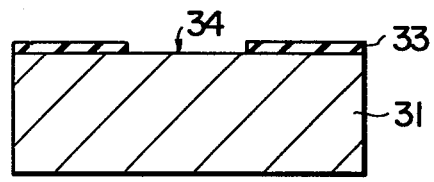
FIGS. 12 to 17 show steps of another embodiment of the present method.

In FIG. 12, an $SiO_2$ film 33 is formed on a surface of an N-type silicon substrate 31 which also serves as a collector region of the transistor, and a first diffusion window 34 for defining a base region is formed in the $SiO_2$ film 33.

Figure 13:
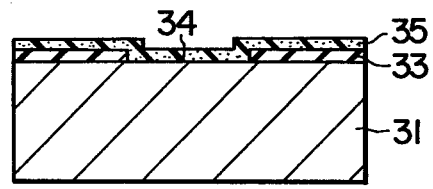

Then, as shown in FIG. 13, a boron containing $SiO_2$ film (boron doped oxide) 35 as a P-type impurity source is formed over the $SiO_2$ film 33 and the window 34.

Figure 14:
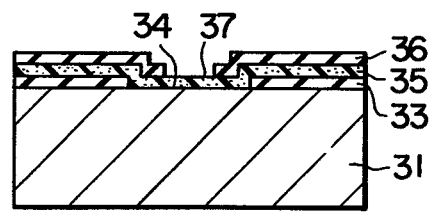

Then, as shown in FIG. 14, an $SiO_2$ film 36 is formed over the boron doped oxide 35, and a second diffusion window 37 for defining an emitter region is formed in the $SiO_2$ film 36.

Figure 15:
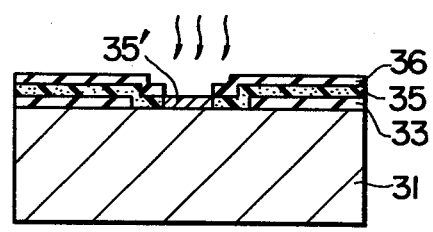

In FIG. 15, the assembly is heat treated in the ammonia atmosphere so that that portion of the boron doped oxide which is exposed by the second diffusion window 37 reacts with the ammonia to convert into a boron nitride containing doped oxide 35'.

Figure 16:
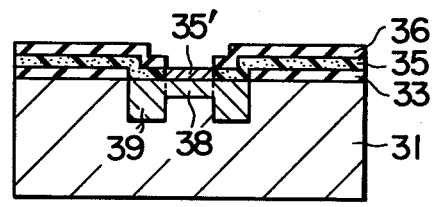

Thereafter the base diffusion process is carried out under a given diffusion condition such that a low concentration, shallow diffusion region 38 and a high concentration, deep diffusion region 39 are simultaneously formed in the base region, as shown in FIG. 16.

Figure 17:
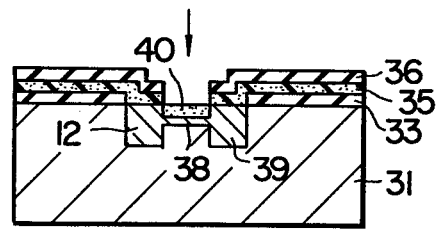

Then, the boron nitride containing impurity source 35' is removed by a well known HF etchant (hydrogen fluoride etchant), and the emitter diffusion is carried out through the window 37 in a well known manner to form an emitter region 40 as shown in FIG. 17.

The transistor thus manufactured has a base region which includes the shallow, low concentration diffusion region 38 and the deep, high concentration diffusion region 39. These two diffusion regions can be formed through a single diffusion process. Furthermore, since the transistor of this structure has an emitter region 40 which has the same shape (mask pattern) as the shallow, low concentration diffusion region 38, the spreading resistance in the base region (that is, the resistance for carriers diffusing laterally in the base region) is small and the response of the transistor is fast. As is well known, a transistor of this structure has an improved amplification factor and breakdown voltage because of the shallow, low concentration diffusion region 38 in the base region and a reduced base resistance because of the deep, high concentration diffusion region 39.

While the previous embodiments used the nitride containing film as the impurity diffusion source which is obtained by the heat treatment of the film containing oxide of the impurity in the ammonia atmosphere, the nitride containing film may be formed simultaneously with the formation of the doped oxide film.

An example thereof is described below. A nitride containing film is formed by reacting tetra-ethyl silicate [$(C_2H_5O)_4Si$] with tri-ethyl borate [$(C_2H_5O)_3B$] in an ammonia gas flow at 670° C to form a composite layer of boron nitride-boron oxide-silicon oxide. This composite layer of boron nitride-boron oxide-silicon oxide is further heat treated in an ammonia atmosphere at 1000° C for about 30 minutes to form a more stable boron diffusion (doping) source. In this manner, the amount of introduction of boron into the silicon body can be controlled to the extent of the surface concentration of $10^{16} - 10^{17}$ atoms/cm$^3$.

In another example, the nitride containing film is formed by reacting tetra-ethyl silicate [$(C_2H_5O)_4Si$]

with diborane ($B_2H_6$) in an ammonia atmosphere at 670° C to form a composite layer of boron nitride-boron oxide-silicon oxide. When the composite film of this composition is used as the impurity diffusion source, a heat treatment in the ammonia atmosphere at 1000° C for about 30 minutes is preferable to provide an impurity doping source for low concentration diffusion.

What is claimed is:

1. A method for diffusing an impurity into a semiconductor body comprising the steps of forming an impurity containing silicon oxide layer on a semiconductor substrate, and heat treating the resultant substrate in an ammonia containing atmosphere, the impurity containing silicon oxide layer being selectively exposed to said atmosphere.

2. A method for diffusing an impurity into a semiconductor body according to claim 1, wherein said impurity is an element selected from the elements of group III.

3. A method for diffusing an impurity into a semiconductor body according to claim 2 wherein said group III elements are boron, aluminum and gallium.

4. A method for diffusing an impurity into a semiconductor body according to claim 1, wherein said heat treatment in the ammonia containing atmosphere is carried out at a temperature of 600° C – 1200° C.

5. A method for diffusing an impurity into a semiconductor body according to claim 1 wherein the step of forming the impurity containing silicon oxide layer includes reacting alkyl oxysilane with an impurity containing gas in said ammonia atmosphere.

6. A method for diffusing an impurity into a semiconductor body according to claim 1, wherein said impurity containing silicon oxide is a three-system composition of a nitride of the impurity element, an oxide of the impurity element and silicon oxide.

7. A method for diffusing an impurity into a semiconductor body comprising the steps of forming an impurity containing silicon oxide layer on a semiconductor substrate, forming an ammonia impermeable coating on said silicon oxide layer, forming a window at a selected area in said coating, and heat treating the substrate in an ammonia containing atmosphere.

8. A method for diffusing an impurity into a semiconductor body according to claim 7, wherein said ammonia impermeable coating is a silicon oxide film.

9. A method for diffusing an impurity into a semiconductor body according to claim 7 wherein the step of forming the impurity containing silicon oxide layer includes reacting alkyl oxysilane with an impurity containing gas in said ammonia atmosphere.

10. A method for diffusing an impurity into a semiconductor body according to claim 7, wherein said impurity containing silicon oxide is a three-system composition of a nitride of the impurity element, an oxide of the impurity element and silicon oxide.

* * * * *

UNITED STATES PATENT AND TRADEMARK OFFICE
CERTIFICATE OF CORRECTION

PATENT NO. : 4,102,715
DATED : July 25, 1978
INVENTOR(S) : Ginjiro KAMBARA et al It is certified that error appears in the above-identified patent and that said Letters Patent are hereby corrected as shown below:

Please change the name of the Assignee from "MATSUSHITA ELECTRIC INDUSTRIAL CO., LTD." to -- MATSUSHITA ELECTRONICS CORPORATION --.

Signed and Sealed this

Twenty-fourth Day of April 1979

[SEAL]

Attest:

RUTH C. MASON
Attesting Officer

DONALD W. BANNER
Commissioner of Patents and Trademarks